US005789986A

United States Patent [19]
Drost et al.

[11] Patent Number: 5,789,986
[45] Date of Patent: Aug. 4, 1998

[54] FREQUENCY CONTROLLED BIAS GENERATOR FOR STABILIZING CLOCK GENERATION CIRCUITS

[75] Inventors: Robert Drost, Palo Alto; Robert Bosnyak, San Jose, both of Calif.

[73] Assignee: Sun Microsystems, Inc., Mountain View, Calif.

[21] Appl. No.: 682,360

[22] Filed: Jul. 17, 1996

[51] Int. Cl.$^6$ .................................................. H03L 7/093

[52] U.S. Cl. ................................. 331/2; 331/17; 331/25; 331/34; 331/57

[58] Field of Search ........................ 331/2, 17, 25, 331/34, 57

[56] References Cited

U.S. PATENT DOCUMENTS

| | | | |
|---|---|---|---|
| 4,567,448 | 1/1986 | Ikeda | 331/25 |
| 4,904,955 | 2/1990 | Ley | 331/2 |
| 5,523,723 | 6/1996 | Arcus et al. | 331/17 |
| 5,565,817 | 10/1996 | Lakshmikumar | 331/57 |
| 5,596,302 | 1/1997 | Mastrocola et al. | 331/57 |

Primary Examiner—Siegfried H. Grimm
Attorney, Agent, or Firm—Hecker & Harriman

[57] ABSTRACT

The present invention is a frequency controlled bias generator for stabilizing clock generation circuits. The invention includes a Bias VCO and a clock feedback circuit along with a Phase Frequency Detector for tracking and correcting variations in the frequencies of a High Speed VCO. According to the invention, variations in the frequency of the High Speed VCO are tracked and adjusted across process, temperature, and voltage variations. The invention compares the frequencies of an internal clock generated by Bias VCO with an external clock. When the internal clock frequency is undesirably high or low (based on undesirable variations in process, temperature, and voltage parameters), bias currents provided to the High Speed VCO and the Bias VCO are adjusted such that the frequencies of the Bias VCO and the High Speed VCO are adjusted to offset the variations in process, temperature, and voltage parameters. The bias currents provided to the Bias VCO and the High Speed VCO are matched. The value of the bias currents is dependent upon the relative frequency of the internal clock (generated by the Bias VCO) and the external clock. Further, the internal bias voltage generators of the Bias VCO and the High Speed VCO are also matched. Accordingly, when the frequency of the Bias VCO is adjusted in response to the bias current adjustment, the frequency of High Speed VCO is also adjusted. The adjustment of High Speed VCO's frequency results in an adjustment of the invention's clock signal output.

27 Claims, 5 Drawing Sheets

FREQUENCY CONTROLLED BIAS GENERATOR FOR STABILIZING CLOCK GENERATION CIRCUITS

BACKGROUND OF THE INVENTION

1. Field of the Invention

The present invention relates to the field of frequency controlled bias generators.

2. Background Art

In clock recovery circuits a phase lock loop or delay lock loop is typically used to extract the clock signal from a digital data signal which does not have transitions at each possible position. Such digital data signal can be for example some form of a NRZ (Non-Return to Zero) data signal. In recovering the clock signal, typical locking loops suffer from variations in operational behaviors of the lock loop. These behavior variations are a result of variations in the process parameters which include variations in doping profiles and levels, variations in feature sizes (for example, variations in channel length of transistors), and variations in depth of junctions (for example, variations in the depth of drain and source junction depths for MOS processes and variations in emitter, collector, and base junction depths for bipolar processes).

Other variations causing behavior variations in phase lock loops are variations in temperature. Variations in temperature result in change in semiconductor characteristics which in turn result in a behavior change of lock loops. For example, an increase in temperature increases resistivity of both P-type and N-type material, thus resulting in larger delays in both bipolar and MOS circuits. Conversely, a decrease in temperature decreases resistivity of both P-type and N-type material thus resulting in smaller delays. Another cause of behavior variations in lock loops is variations in the voltage supply which results in variations in delay. For example, a lower level of supply voltage results in larger delays as opposed to a higher level of supply voltage which results in smaller delays.

Digital CMOS lock loops pose a greater difficulty than that presented in bipolar circuits to overcome behavior variations resulting from process, temperature, or voltage changes. This is because the CMOS fabrication process typically contains no adequately controlled resistors and no bipolar transistors to compensate for variations in behavior of the CMOS devices. In bipolar fabrication processes, controlled resistors and bipolar transistors are utilized in design of bias generators, using known methods in the art, to provide near-constant current or voltage across process, temperature, and voltage conditions. This near-constant current or voltage substantially reduces behavior variations in bipolar lock loops. Without the controlled resistors and bipolar transistors the circuit designer is forced to accept either a less stable on-chip reference generator, or alternatively, use up valuable pins to bring in a current or voltage reference from sources external to the chip.

Providing controlled resistors or bipolar transistors in a CMOS process would significantly increase the cost of CMOS chips. Bringing the voltage or current reference from sources external to the chip, in addition to using up valuable pins, also creates other problems such as noise coupling onto the reference signal through package and board level parasitics. Thus, the present CMOS lock loops must either use an external reference with its accompanying problems stated above, or alternatively use a less stable on-chip reference. Ineither case, the voltage or current reference will not track process, temperature and supply voltage variations.

Accordingly, the center frequency of the voltage/current controlled oscillator of the CMOS lock loop, or the center delay of the voltage/current controlled delay line of the CMOS lock loop, will not be constant across process, temperature, and supply voltage variations.

The following publications have touched upon the problems with CMOS lock loops, but they have not resolved the problem of providing a stable and constant center frequency and a stable and constant center delay of the delay line for CMOS lock loops: "Single-Chip 1062 Mbaud CMOS Transceiver for Serial Data Communication" by J. Ewen, 1995 International Solid-State Circuits Conference; "An Input-Free Vt Extractor Using a Two-Transistor Differential Amplifier" by Mark Johnson, IEEE Journal of the Solid-State Circuits, Vol. 28, No. 6, pp. 704–705, June 1993. "The Design of High-Performance Analog Circuits on Digital CMOS Chips" by Eric A. Vittoz, IEEE Journal of Solid-State Circuits, ol. SC-20, no. 3, pp. 657–665, June 1985; "Low-Jitter and Process-Independent DLL and PLL Basd on Self-Biased Techniques" by John G. Maneatis, 1996 International Solid State Circuit Conference, pp. 130–131.

Thus, there is need in the art for a circuit for providing a stable and constant center frequency and a stable and constant center delay of the delay line of CMOS lock loops across process, temperature and supply voltage variations.

SUMMARY OF THE INVENTION

The present invention is a frequency controlled bias generator for stabilizing clock generation circuits. The invention includes a Bias VCO and a clock feedback circuit along with a Phase Frequency Detector for tracking and correcting variations in the frequencies of a High Speed VCO. According to the invention, variations in the frequency of the High Speed VCO are tracked and adjusted across process, temperature, and voltage variations.

The invention compares the frequencies of an internal clock generated by Bias VCO with an external clock. When the internal clock frequency is undesirably high or low (based on undesirable variations in process, temperature, and voltage parameters), bias currents provided to the High Speed VCO and the Bias VCO are adjusted such that the frequencies the Bias VCO and the High Speed VCO are adjusted to offset the variations in process, temperature, and voltage parameters. The bias currents provided to the Bias VCO and the High Speed VCO are matched. The value of the bias currents is dependent upon the relative frequency of the internal clock (generated by the Bias VCO) and the external clock. Further, the internal bias voltage generators of the Bias VCO and the High Speed VCO are also matched. Accordingly, when the frequency of the Bias VCO is adjusted in response to the bias current adjustment, the frequency of the High Speed VCO is also adjusted. The adjustment of the High Speed VCO's frequency results in an adjustment of the invention's clock signal output. In this manner, variations in the frequency of the invention's clock signal are tracked and adjusted across process, temperature, and voltage variations.

DETAILED DESCRIPTION OF THE INVENTION

A frequency controlled bias generator for stabilizing clock generation circuits is described. In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

The invention produces a VCO center frequency that changes very little across process, temperature, and supply voltage variations. More particularly, the invention's circuit provides a stable and constant center frequency and a stable and constant center delay in CMOS lock loops across process, temperature and supply voltage variations.

The prior art VCO's attempted to have a constant center frequency by providing a reference current (Iref) or reference voltage (Vref) that is stable across process, temperature and voltage variations. Further, the prior art attempted to have a VCO circuit that itself has a stable behavior across process, temperature and voltage changes. As a result, the final output of the VCO circuit is constant because both the Iref (or Vref) and the internal VCO circuit have a stable behavior across changes in process, temperature and voltage. Another prior art technique attempts to vary the Iref (or Vref) in a way so as to offset the effect of variations in the center frequency of the VCO circuit. In other words, instead of attempting to make both Iref (or Verf) and the circuit stable over process, temperature and voltage variations, this technique attempts to compensate for variations in one part of the circuit with offsetting variations in another part of the circuit.

Another prior art technique requires use of resistors in CMOS circuits. Resistors are usually polysilicon or N-well resistors. These resistors typically vary ten to twenty times in magnitude in response to process and temperature changes. The invention depends solely on CMOS elements (i.e. PMOS and NMOS transistors). The variations in conductivity of these elements is only about 30%. Accordingly, this is a much more reliable technique than the prior art requirement of using resistors in CMOS VCO circuits.

Figure 1A:
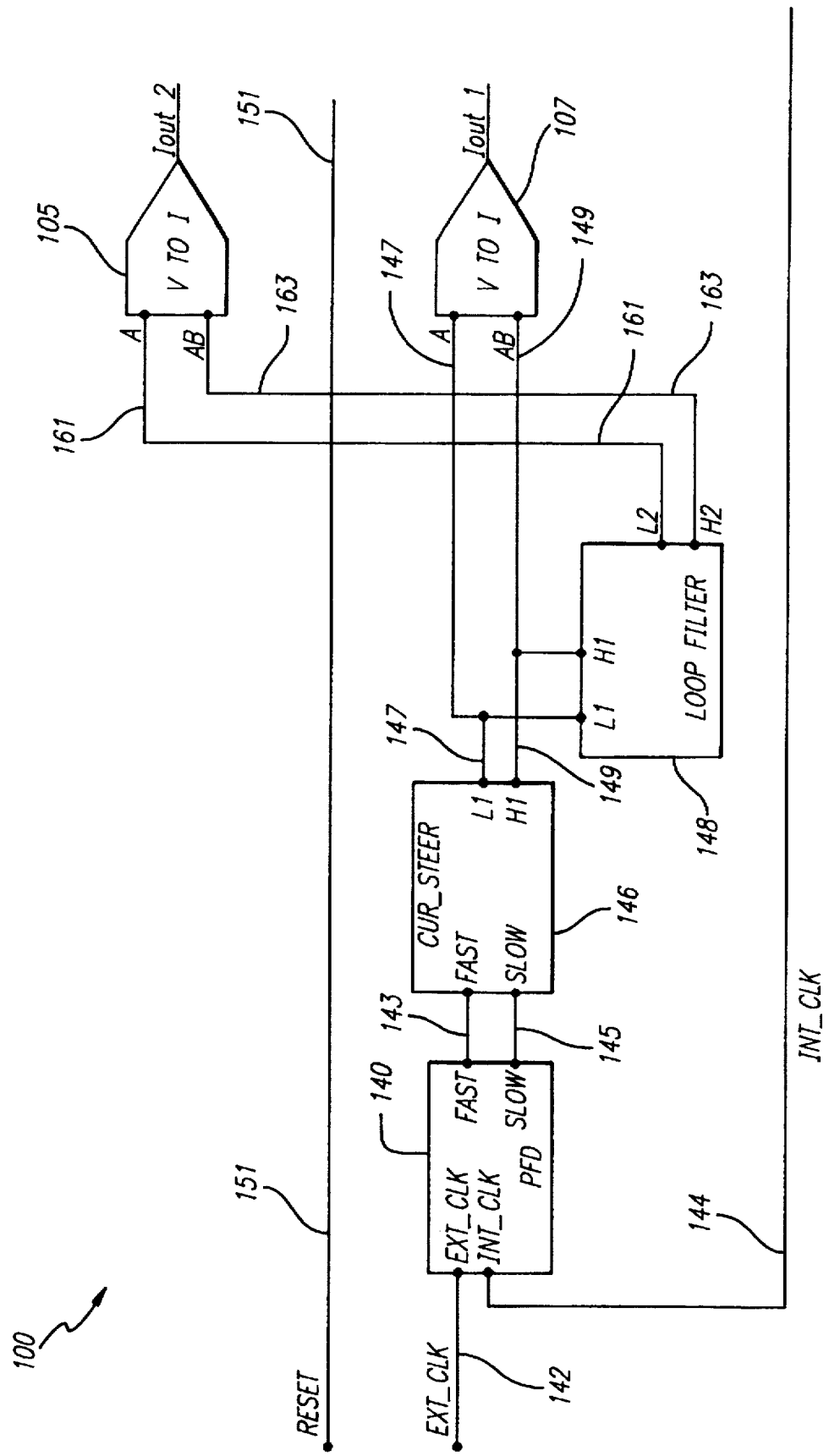
FIGS. 1A and 1B illustrate the invention's dock generation circuit.
Figure 1B:
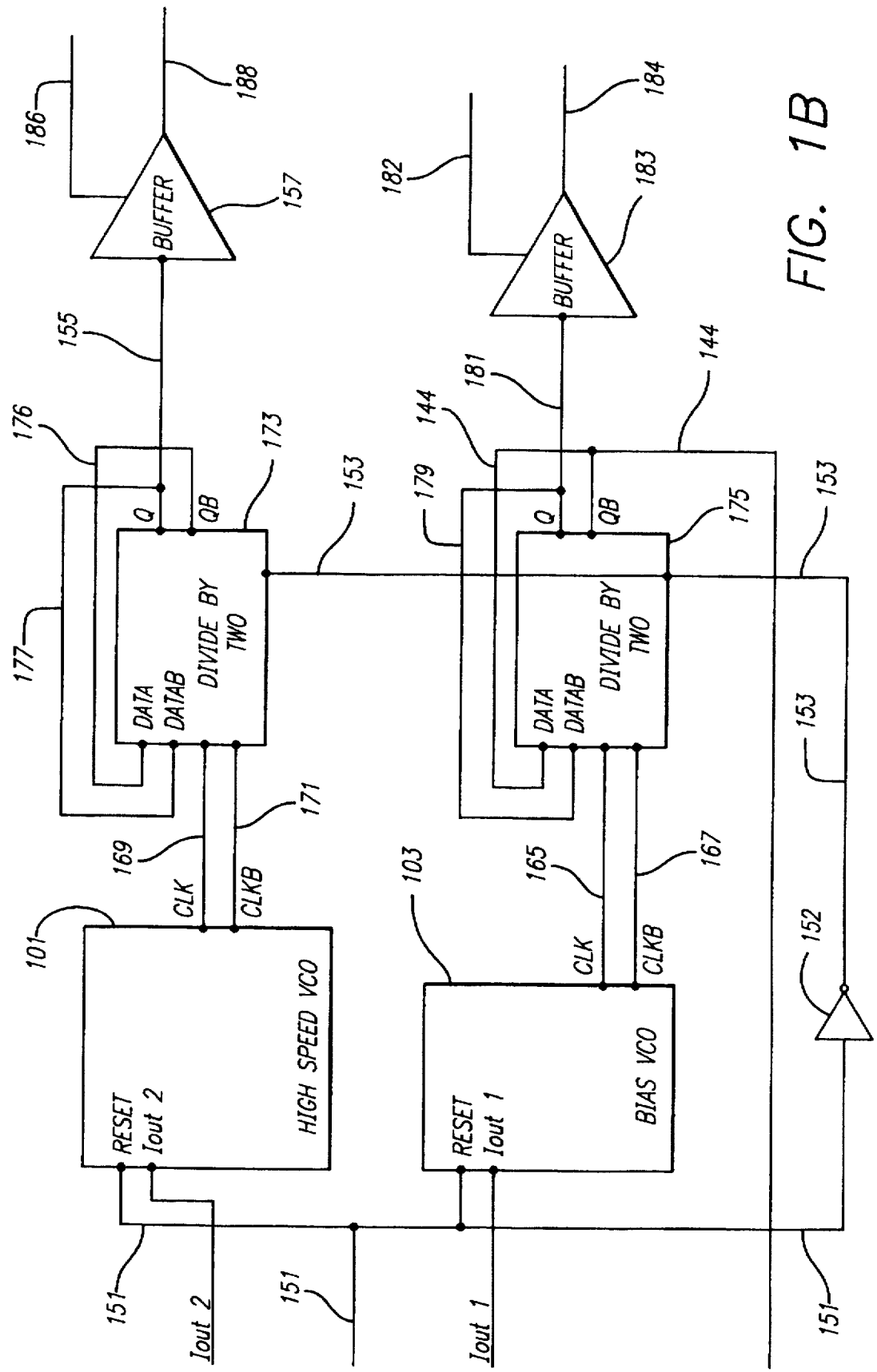

FIGS. 1A and 1B show circuit 100 of the present invention. FIGS. 1A and 1B include circuit modules Phase Frequency Detection ("PFD") 140, Current Steering 146, Loop Filter 148, Voltage to Current ("V to I") 107, Voltage to Current ("V-to-I") 105, High Speed VCO 101, Bias VCO 103, Divide by Two 173, Divide by Two 175, Buffer 157, and Buffer 183. As shown in FIGS. 1A and 1B, external clock signal 142 is coupled to ext-clk input of PFD 140. Internal clock signal 144 is coupled to int-clk input of PFD 140. "Fast" output of PFD 140 is coupled to "Fast" input of Current Steering (cur-steer) circuit 146 via interconnect 143. "Slow" output of PFD 140 is coupled to "Slow" input of Current Steering (cur-steer) circuit 146 via interconnect 145. Output L1 of cur-steer circuit 146 is coupled to input L1 of Loop Filter 148 via interconnect 147. Output H1 of cur-steer circuit 146 is coupled to input H1 of Loop Filter 148 via interconnect 149.

Output L1 of cur-steer circuit 146 is coupled to input A of V-to-I 107 via interconnect 147. Output H1 of cur-steer circuit 146 is coupled to input AB of V-to-I 107 via interconnect 149. Output L2 of Loop Filter 148 is coupled to input A of V-to-I 105 via interconnect 161. Output H2 of Loop Filter 148 is coupled to input AB of V-to-I 105 via interconnect 163. Iout1 output of V-to-I 107 is coupled to Iout1 input of Bias VCO 103. Iout2 output of V-to-I 105 is coupled to Iout2 input of High Speed VCO 101. Reset 151 is coupled to Bias VCO 103 and also to High Speed VCO 101. Clk 169 and ClkB 171 outputs of High Speed VCO 101 are coupled to Divide by Two 173 while Clk 165 and ClkB 167 outputs of Bias VCO 103 are coupled to Divide by Two 175.

Output "Q" of Divide by Two 173 is coupled to its DataB input via interconnect 177. Output "QB" of Divide by Two 173 is coupled to its Data input via interconnect 176. Output "Q" of Divide by Two 175 is coupled to its DataB input via interconnect 179. Output "Q" of Divide by Two 173 is also coupled to Buffer 157. Buffer 157 generates outputs 186 and 188 which are True and Inverted outputs respectively. Output "QB" of Divide by Two 175 is coupled to its Data input via interconnect 144. Output "QB" is also the internal clock signal which is carried back to PFD 140 as stated above. Output "Q" of Divide by Two 175 is also coupled to Buffer 183. Buffer 183 generates outputs 182 and 184 which are True and Inverted outputs respectively. Reset Signal 151 is inverted and coupled to both Divide by Two 175 and Divide by Two 173 via interconnect 153.

Figure 2:
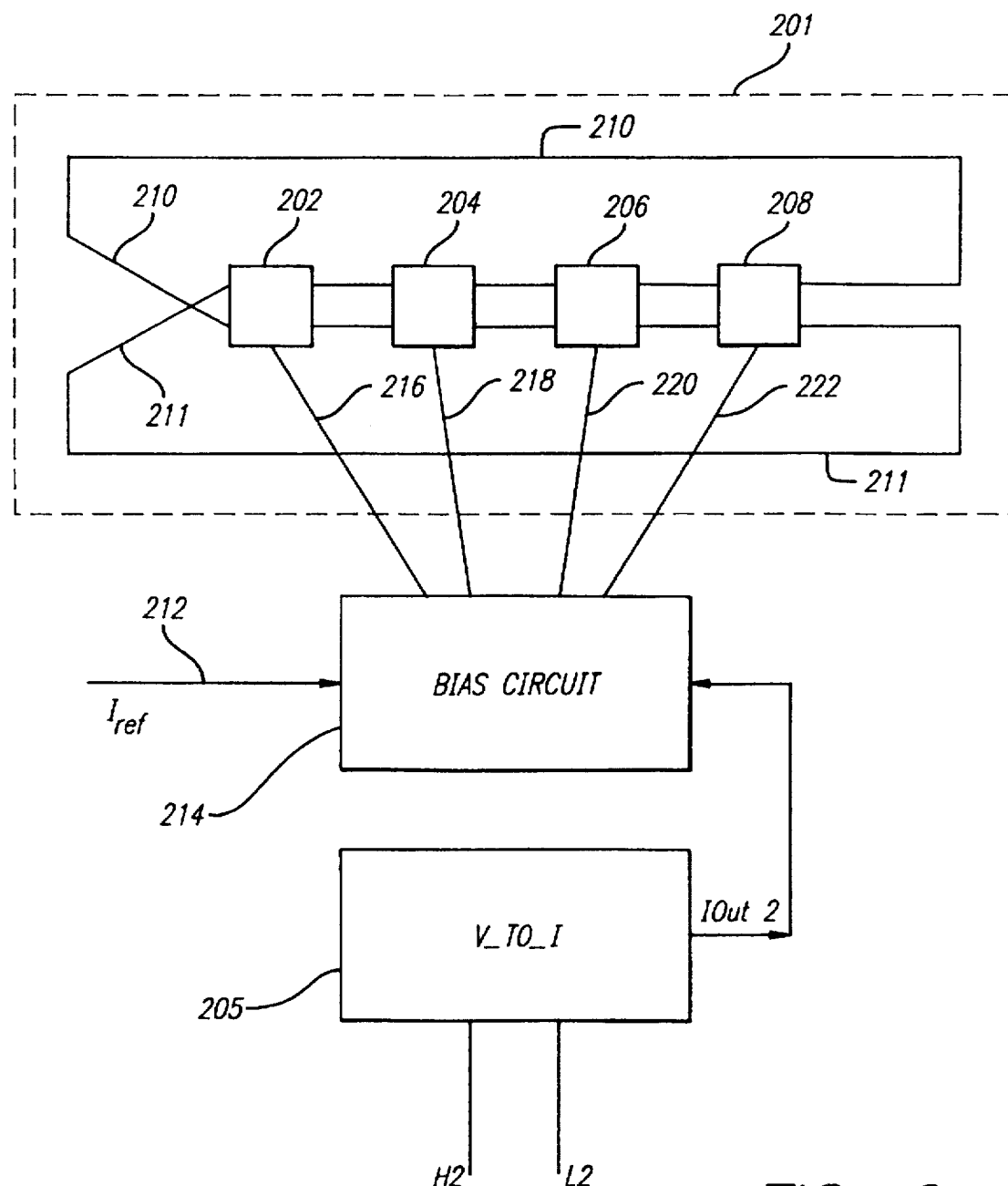
FIG. 2 shows the High Speed VCO circuit of FIGS. 1A and 1B in more detail.

High Speed VCO 101 is shown in more detail in FIG. 2 as VCO 201 (Bias VCO 103 is also very similar to High Speed VCO 101, and for that reason is not separately shown or discussed). As shown in FIG. 2, VCO 201 comprises four delay stages 202, 204, 206, and 208, and feedback loops 210 and 211. Each stage introduces a certain phase delay in the VCO circuit. When the feedback loops 210 and 211 are closed as shown in FIG. 2, the VCO will oscillate if the total phase shift through the four stages is an integer multiple of 360 degrees. The frequency of oscillation of the VCO depends upon the total time delay introduced by the four delay stages 202, 204, 206, and 208 (the longer the time delay, the lower the frequency, and the shorter the time delay, the higher the frequency of the oscillation). Typically the stages are replicates of each other and thus the delay introduced by each stage is the same, given that their bias voltages are also the same.

The reference current Iout2 (same as reference current Iout2 shown in FIG. 1) feeds a bias circuit 214 (it is noted that bias circuit 214 in High Speed VCO 101 is matched to the corresponding bias circuit in Bias VCO 103 which is not separately illustrated here). In response to the particular value of Iref 212, the bias circuit 214 generates a number of control voltages 216, 218, 220, and 222. Each of these control voltages feeds a respective delay stage 202, 204, 206, and 208. Typically the voltage level of control voltages 216 through 222 are the same such that the delay introduced by each stage 202 through 208 is the same. For some applications, however, the delay of each stage could be different and the VCO circuit can still function properly. Further, the number of stages can be greater or fewer than the four stages shown in FIG. 2. As long as the total phase shift across the VCO is a multiple of 360 degrees the VCO will function properly. Fewer stages may be more appropriate since fewer stages result in a reduction of power consumption. As shown in FIG. 2, a V-to-I circuit 205 (which is the same as V-to-I circuit 105 shown in FIG. 1) provides the reference current Iout2 to bias circuit 214.

As stated above, bias circuit 214 of VCO 101 is matched with the corresponding bias circuit of VCO 103. In other words, for the same reference current Iref 212, the same bias voltage is outputted by both bias circuits. Thus, the bias voltage on lines 216, 218, 220, and 222 for VCO 101 would be the same as the respective lines for VCO 103.

Figure 3:
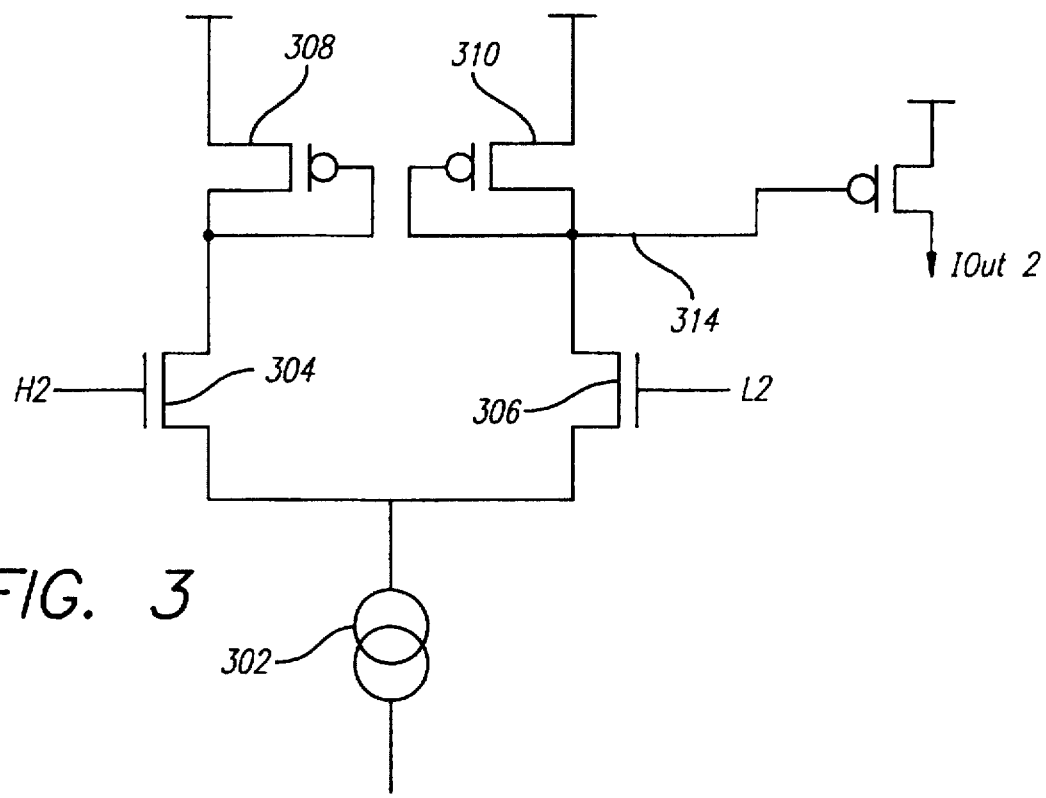
FIG. 3 illustrates the V-to-I circuits of FIGS. 1A and 1B in more detail.

V-to-I circuit 105 is shown in more detail in FIG. 3 (V-to-I circuit 107 is similar to and is matched to V-to-I circuit 105 which is not shown or discussed separately). Current source 302 is coupled to the common node formed by connection of sources of NMOS transistors 304 and 306. The gate of transistor 304 is coupled to signal H2 while the gate of transistor 306 is coupled to signal L2. PMOS transistor 308 shares its drain with the drain of NMOS transistor 304. PMOS transistor 310 shares its drain with the drain of NMOS transistor 306. The sources of PMOS transistors 308 and 310 are coupled to the supply voltage. The gate of transistor 308 is connected to its drain, while the gate of transistor 310 is connected to its respective drain. Node 314 (formed by the connection of drains of transistors 310 and 306 and the gate of transistor 310) is coupled to the gate of PMOS transistor 312. The source of transistor 312 is coupled to the supply voltage while its drain provides an output current Iout2. This current is the same as current Iout2 shown in FIG. 1.

Current source 302 provides a relatively constant current to the V-to-I circuit 105. This current is allowed to have a large variation across process, voltage, and temperature conditions. For a large variation in the current, the inputs H2 and L2 can compensate for this variation by moving to appropriate voltage levels as described below. Variations in the voltage levels at H2 and L2 change the amount of current I1 flowing from transistor 310 into transistor 306. Specifically, when H2 is increased and L2 is decreased, current I1 is reduced. Conversely, when H2 is decreased and L2 is increased, current I1 increases. When current I1 is increased, voltage Vout (the voltage at the drain of transistor 310) is reduced since the voltage drop across PMOS transistor 310 is increased. Conversely, when current I1 is reduced, voltage Vout is increased. As the voltage at the gate of transistor 312 is reduced, current Iout2 is proportionally increased. Thus, as current I1 increases, current Iout2 is proportionally increased. Conversely, as the voltage at the gate of transistor 312 is increased, current Iout2 is proportionally decreased.Thus, as current I1 decreases, current Iout2 is proportionally decreased. If transistor 312 is chosen to have a width to length ratio ten times the width the length ratio of transistor 310, the current in transistor 312 would be ten times as large. Thus, each microamp increase in I1 would translate to a 10 microamp increase in Iout2. Likewise, each microamp decrease in I1 would translate to a 10 microamp decrease in Iout2. As stated above, V-to-I 105 is matched to V-to-I 107. In other words, for the same relative inputs to V-to-I 105 and V-to-I 107, the outputs Iout1 and Iout2 will have the same relative relations.

Figure 4:
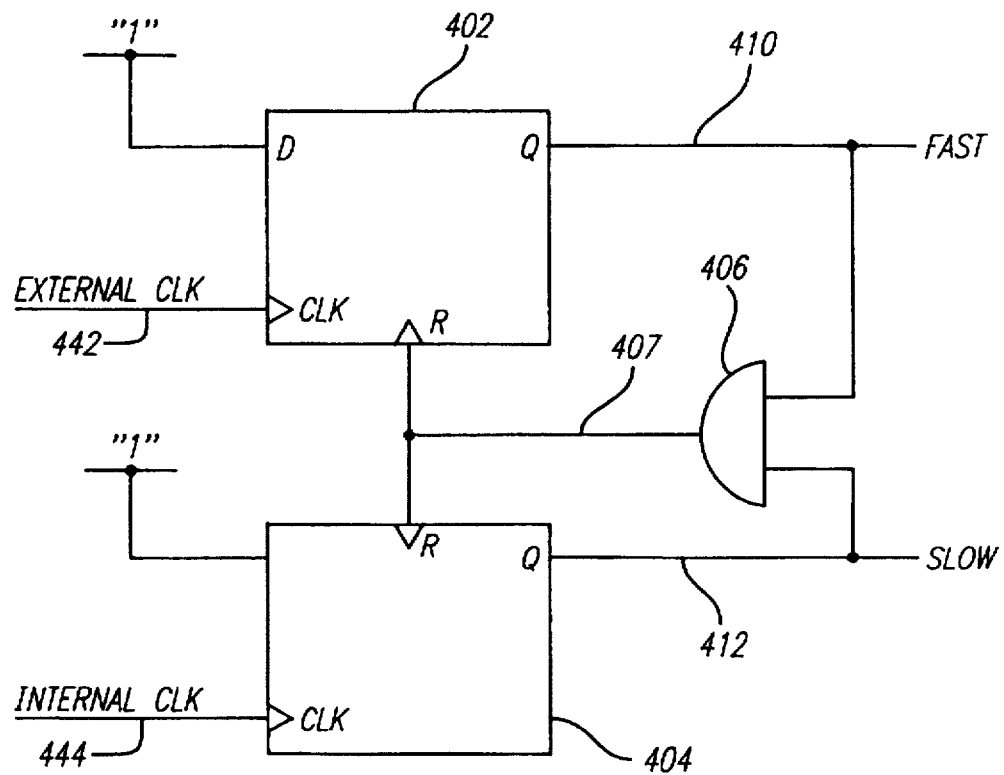
FIG. 4 is a more detailed illustration of the Phase Frequency Detector shown in FIG. 1.

Phase Frequency Detector 140 (PFD 140) is shown in more detail in FIG. 4. As shown in FIG. 4, D flip flop 402 has its Data input (or D input) coupled to supply voltage and its clock input to external clock 442 (external clock 442 is the same as external clock 142 shown in FIG. 1). D flip flop 404 has its D input coupled to supply voltage and its clock input to internal clock 444 (internal clock 444 is the same as internal clock 144 shown in FIG. 1). Output Q of D flip flop 402 is called "Fast." Output Q of D flip flop 404 is called "Slow." The Fast output is coupled to AND gate 406 through interconnect 410, while the Slow output is coupled to AND gate 406 through interconnect 412. Output 407 of AND gate 406 is coupled to the Reset (R) input of the D flip flops.

During operation the "Fast" and "Slow" outputs duty cycles reflect the relative phase and frequencies of external clock 442 and internal clock 444. More specifically, the "Fast" output would remain high longer than it would remain low when the frequency of external clock is greater than the frequency of the internal clock. As the frequency of the external clock increases, the duration of the high state of the "Fast" output also increases. Likewise, the "Slow" output would remain high longer than it would remain low when the frequency of internal clock is greater than the frequency of the external clock. As the frequency of the internal clock increases, the duration of the high state of the "Slow" output also increases. In other words, the average values of "Fast" and "Slow" outputs are determined based on the relative frequencies of the external and internal clocks. If the two clocks are the same frequency, then the fast signal will have a wider pulse if the external clock leads the internal clock in phase. Likewise, the slow signal will have a wider pulse if the internal clock leads the external clock in phase.

Current steering circuit 146 is not shown in detail. However, current steering circuit 146 behaves in a manner such that when its "Fast" input 143 has a wider pulse width than its "Slow" input 145, more current will be directed to its H1 149 output and less current directed to its L1 147 output. Likewise, when the "Slow" input 145 has a wider pulse width than the "Fast" input 143, more current will be directed to its L1 147 output and less current directed to its H1 149 output.

Figure 5:
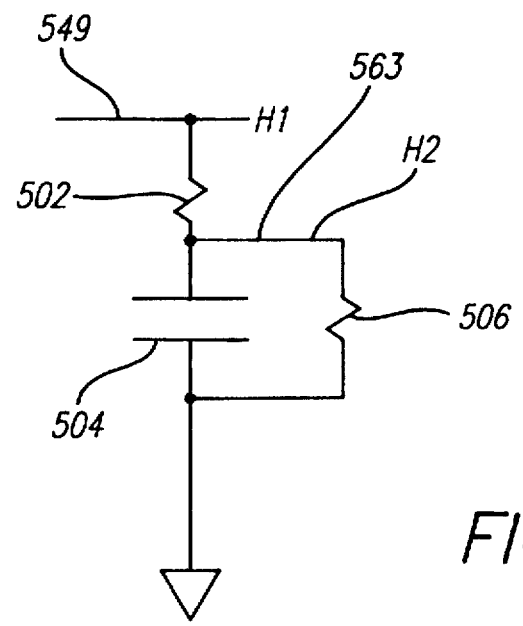
FIG. 5 is a more detailed illustration of a first low pass filter of the Loop Filter shown in FIG. 1.
Figure 6:
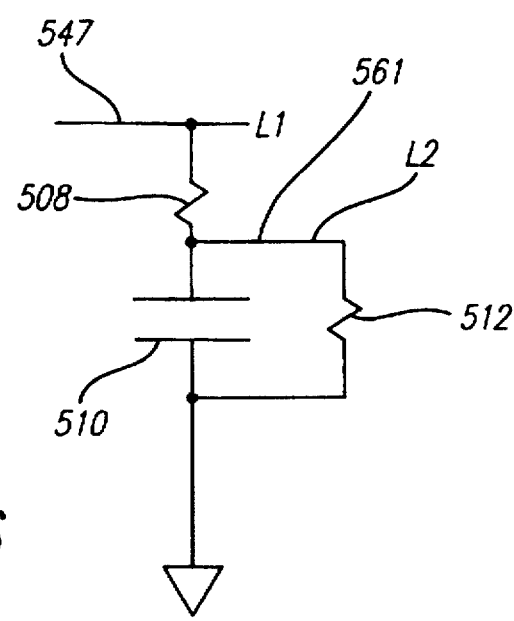
FIG. 6 is a more detailed illustration of a second low pass filter of the Loop Filter shown in FIG. 1.

Loop Filter 148 is shown in more detail in FIG. 5 and FIG. 6. Loop Filter 148 includes two identical low pass filters. The first low pass filter is illustrated in FIG. 5 and includes resistor 502 coupled in series with the parallel combination of capacitor 504 and resistor 506 as shown. The second low pass filter is illustrated in FIG. 6 and includes resistor 508 coupled in series with the parallel combination of capacitor 510 and resistor 512. One terminal of resistor 502 is coupled to output H1 of current steering circuit 146. Output H1 (shown as node 549) is the same as H1 149 shown in FIG. 1. One terminal of resistor 508 is coupled to output L1 of current steering circuit 146. Output L1 (shown as node 547) is the same as L1 147 shown in FIG. 1. The output of the first low pass filter H2 563 is also shown as H2 163 shown in FIG. 1. The output of the second low pass filter L2 561 is also shown as L2 161 shown in FIG. 1.

Output H2 563 does not include "high frequencies" present in H1 549. Output H2 563 is also a less noisy node than H1 549. This is because capacitor 504 reduces noise due to voltage jitters (since the voltage across a capacitor cannot change instantaneously). Similarly, output L2 561 does not include "high frequencies" present in L1 547. Output L2 561 is also a less noisy node than L1 547. This is because capacitor 510 reduces noise due to voltage jitters (since the voltage across a capacitor cannot change instantaneously).

As shown in FIG. 1, V-to-I 107 gets inputs L1 147 and H1 149, which have the same relative relations as L2 161 and H2 163 which feed V-to-I 105. However, L2 161 and H2 163 are less noisy than L1 147 and H1 149. It is noted that Iout1 (the output of V-to-I 107) can be made the same or can be made proportional to Iout2 (the output of V-to-I 105). Whether Iout1 is the same or different than (but proportional to) Iout2 depends on the relative sizes of the transistors in V-to-I 107 and V-to-I 105. However, the variations in Iout1 and Iout2 will track across process, temperature, and voltage.

Circuits 173 and 175 are "Divide by Two" circuits and are made and operate in a manner known in the art. These circuits divide the clock frequency by two and make the clock output more symmetrical. Circuits 157 and 183 are buffers which provide a low impedance output for driving large loads with the clock signals generated by circuit 100. Internal clock 144 is tapped off of QB node of Divide by Two circuit 175. Internal clock 144 is routed to PFD circuit 140 as shown in FIG. 1.

During operation of circuit 100, the frequencies and phase of internal clock 144 and external clock 142 feeding PFD 140 are compared. Based on the relative frequencies and phase of the internal and external clocks, the pulse width of Fast 143 and Slow 145 signals vary in the manner described above. In response to the relative pulse widths of the Fast and Slow signals, current steering 146 will steer more or less current to outputs H1 149 and L1 147 in the manner discussed above. Loop Filter 148 provides a differential voltage to both V-to-I 105 and V-to-I 107 in the manner described above. V-to-I 107 outputs a current Iout2 in response to the differential voltage provided by Loop Filter 148. Similarly, V-to-I 105 outputs a current Iout1 in response to the differential voltage provided by Loop Filter 148. As discussed above, these currents can be the same or proportional depending on the relative sizes of transistors comprising each of V-to-I 105 and V-to-I 107. V-to-I 105 and V-to-I 107 are matched to each other such that variations in process, temperature and voltage affects both Iout1 and Iout2 in the same manner and to the same degree.

Iout2 provides a bias current to bias circuit 214 of High Speed VCO 101 as shown in FIG. 2. Iout1 provides a bias current to the corresponding bias circuit (not shown) of Bias VCO 103. Based on the relative level of Iref 212 current and Iout2, the bias voltages on lines 216, 218, 220, and 222 are adjusted. Adjusting these bias voltages results in adjustment of the delay in delay elements 202 through 208 in FIG. 2. Change in delay results in change in the oscillation frequency of VCO 101. Thus, variations in Iout2 results in variations in the oscillation frequency of VCO 101. Likewise, variations in Iout1 results in variations in oscillation frequency of VCO 103.

Clk 165 output of VCO 103 is fed to Divide by Two 175, and after being made more symmetrical and being divided by two is fed back to PFD 140. Clk 169 output of VCO 101 is fed to Divide by Two 173 and then inputted to buffer 157 for driving large loads. Likewise, output of Divide by Two 175 is inputted to buffer 183 to drive large loads, or to be used as a test point connected to a package pin as desired.

Thus changes in the oscillation frequency of VCO 101 track changes in oscillation frequency of VCO 103. The tracking of these two oscillation frequencies is substantially independent of variations in process, temperature and voltage. In other words, the oscillation frequencies of VCO 101 and VCO 103 change in the same manner and to the same degree across process, temperature and voltage. The feedback provided by internal clock 144 to PFD 140 ensures that variations in process, temperature and voltage are reflected in the relative pulse widths of Fast 143 and Slow 145 signals. By way of example, if the process is at the "fast" corner such that all circuits are operating with shorter time delays, the Clk 169 frequency and the internal clock 144 frequency are undesirably high. The undesirable increase in the frequency of internal clock 144 is determined by comparing internal clock and external clock frequencies at the inputs of PFD 140. This unwanted increase in the frequency of internal clock 144 is reflected in the relative pulse widths of Fast 143 and Slow 145 signals. This in turn translates to variations in Iout1 and Iout2 in the manner discussed above. These variations are such that the bias conditions in both VCO 101 and VCO 103 are changed in the direction of adding more delay to the delay elements making up VCO 101 and VCO 103.

The additional delay introduced in both VCO 101 and VCO 103 results in lowering both internal clock 144 frequency and the frequency of Clk 169 output of VCO 101. This decrease in frequency of internal clock 144 and Clk 169 is desirable since it offsets the effect of the "fast" process corner. Thus, the invention's circuit 100 utilizes Bias VCO 103 and the internal clock 144 feedback to PFD 140 such that the frequency of Clk 169 output of High Speed VCO 101 is adjusted to compensate for any variations in process, temperature, and voltage that would cause a change in the frequency of Clk 169. Thus, bias generates V-to-I 105 and V-to-I 107 provide bias currents Iout1 and Iout2 responsive to frequency variations of internal clock 144 in order to compensate for variations in process, temperature and voltage. The frequency controlled bias current values of Iout1 and Iout2 results in a more stable Clk 169 output.

Although the invention has been described with reference to certain embodiments, it is appreciated by those skilled in the art that changes in various details may be made without departing from the invention defined in the appended claims. Thus, a frequency controlled bias generator for stabilizing clock generation circuits has been described.

We claim:

1. An output clock generation circuit comprising:
    a first VCO coupled to a first bias current, said first VCO generating an internal clock;
    a second VCO coupled to a second bias current, said second VCO generating said output clock;
    comparing means for comparing a frequency of said internal clock with a frequency of an external clock and for generating a plurality of pulsed output signals;
    means, coupled to said comparing means, for receiving said plurality of pulsed output signals from said comparing means and for causing said first and second bias currents to track said frequency of said internal clock wherein said means comprises a current steering circuit for steering current to a first output node and to a second output node based on relative pulse widths of said pulsed output signals;
    wherein variations in said frequency of said internal clock cause said second bias current to vary so as to change a frequency of said output clock.

2. The circuit of claim 1 wherein variations in process parameters change said second bias current so as to cause said frequency of said output clock to remain substantially unchanged.

3. The circuit of claim 1 wherein variations in said frequency of said internal clock causes said first bias current to vary so as to change said frequency of said internal clock.

4. The circuit of claim 3 wherein variations in process parameters change said first bias current so as to cause said frequency of said internal clock to remain substantially unchanged.

5. The circuit of claim 1 wherein variations in circuit temperature change said second bias current so as to cause said frequency of said output clock to remain substantially unchanged.

6. The circuit of claim 3 wherein variations in circuit temperature change said first bias current so as to cause said frequency of said internal clock to remain substantially unchanged.

7. The circuit of claim 1 wherein variations in supply voltage change said second bias current so as to cause said frequency of said output clock to remain substantially unchanged.

8. The circuit of claim 3 wherein variations in supply voltage change said first bias current so as to cause said frequency of said internal clock to remain substantially unchanged.

9. The circuit of claim 1 wherein said first bias current feeds a bias voltage circuit of said first VCO.

10. The circuit of claim 9 wherein variations in said first bias current causes variations in a voltage of said bias voltage circuit so as to cause said frequency of said internal dock to vary.

11. The circuit of claim 1 wherein said second bias current feeds a bias voltage circuit of said second VCO.

12. The circuit of claim 11 wherein variations in said second bias current causes variations in a voltage of said bias voltage circuit so as to cause said frequency of said output clock to vary.

13. An output clock generation circuit comprising:
- an internal and an external clock coupled to a phase frequency detector, said phase frequency detector for generating a plurality of pulsed output signals;
- a current steering circuit coupled to said phase frequency detector said current steering circuit for receiving said plurality of pulsed output signals from said phase frequency detector and for steering current to a first output node and to a second output node based on relative pulse widths of said pulsed output signals;
- a loop filter coupled to said current steering circuit;
- a first and second voltage to current circuit coupled to said loop filter and said current steering circuit;
- a first VCO coupled to said first voltage to current circuit, said first VCO generating said internal clock;
- a second VCO coupled to said second voltage to current circuit, said second VCO generating said output clock;
- wherein variations in a frequency of said internal clock cause a change in frequency of said output clock.

14. The circuit of claim 13 wherein said first voltage to current circuit generates a first bias current corresponding to said frequency of said internal clock, said first bias current biasing said first VCO.

15. The circuit of claim 14 wherein variations in said frequency of said internal clock change said first bias current so as to adjust said frequency of said internal clock.

16. The circuit of claim 14 wherein said second voltage to current circuit generates a second bias current corresponding to said frequency of said internal clock, said second bias current biasing said second VCO.

17. The circuit of claim 16 wherein variations in said frequency of said internal clock change said second bias current so as to adjust said frequency of said output clock.

18. The circuit of claim 16 wherein variations in process parameters change said first bias current so as to cause said frequency of said internal clock to remain substantially unchanged.

19. The circuit of claim 16 wherein variations in process parameters change said second bias current so as to cause said frequency of said output clock to remain substantially unchanged.

20. The circuit of claim 14 wherein variations in circuit temperature change said first bias current so as to cause said frequency of said internal clock to remain substantially unchanged.

21. The circuit of claim 16 wherein variations in circuit temperature change said second bias current so as to cause said frequency of said output clock to remain substantially unchanged.

22. The circuit of claim 14 wherein variations in supply voltage change aid first bias current so as to cause said frequency of said internal clock to remain substantially unchanged.

23. The circuit of claim 16 wherein variations in supply voltage change said second bias current so as to cause said frequency of said output clock to remain substantially unchanged .

24. The circuit of claim 16 wherein said first bias current feeds a bias voltage circuit of said first VCO.

25. The circuit of claim 24 wherein variations in said first bias current causes variations in a voltage of said bias voltage circuit so as to cause said frequency of said internal clock to vary.

26. The circuit of claim 16 wherein said second bias current feeds a bias voltage circuit of said second VCO.

27. The circuit of claim 26 wherein variations in said second bias current causes variations in a voltage of said bias voltage circuit so as to cause said frequency of said output clock to vary.

* * * * *